(12) United States Patent
Fan et al.

(10) Patent No.: US 7,777,160 B2
(45) Date of Patent: Aug. 17, 2010

(54) ELECTRODE TUNING METHOD AND APPARATUS FOR A LAYERED HEATER STRUCTURE

(75) Inventors: Wei Fan, Strongsville, OH (US); Benjamin J. Olechnowicz, Stow, OH (US); Marc Schaepkens, Medina, OH (US); David M. Rusinko, Jr., Parma Heights, OH (US); Xiang Liu, Medina, OH (US); John T. Mariner, Avon Lake, OH (US)

(73) Assignee: Momentive Performance Materials Inc., Albany, NY (US)

( * ) Notice: Subject to any disclaimer, the term of this patent is extended or adjusted under 35 U.S.C. 154(b) by 302 days.

(21) Appl. No.: 12/002,381

(22) Filed: Dec. 17, 2007

(65) Prior Publication Data

US 2009/0152259 A1 Jun. 18, 2009

(51) Int. Cl.
*H05B 3/68* (2006.01)
*C23C 16/00* (2006.01)
(52) U.S. Cl. .................................. 219/444.1; 118/724
(58) Field of Classification Search ... 219/443.1–468.2; 118/724, 725; 361/230–235; 279/128
See application file for complete search history.

(56) References Cited

U.S. PATENT DOCUMENTS

| | | | |
|---|---|---|---|
| 5,059,770 A | 10/1991 | Mahawili | |
| 5,231,690 A | 7/1993 | Soma et al. | |
| 5,675,471 A | 10/1997 | Kotecki | |
| 6,072,162 A | 6/2000 | Ito et al. | |
| 6,080,970 A | 6/2000 | Yoshida et al. | |
| 6,133,557 A * | 10/2000 | Kawanabe et al. | .......... 219/544 |
| 6,344,632 B1 | 2/2002 | Yu et al. | |
| 6,491,978 B1 | 12/2002 | Kalyanam | |
| 6,636,668 B1 | 10/2003 | Al-hemyari et al. | |
| 6,717,116 B1 | 4/2004 | Ito et al. | |
| 6,936,343 B1 | 8/2005 | Hiramatsu et al. | |
| 6,956,186 B1 | 10/2005 | Ito et al. | |
| 6,967,312 B2 | 11/2005 | Hiramatsu et al. | |
| 7,011,874 B2 | 3/2006 | Ito et al. | |
| 7,173,219 B2 | 2/2007 | Okajima et al. | |
| 7,224,256 B2 | 5/2007 | Parsons | |
| 2003/0089457 A1 | 5/2003 | Nallan et al. | |
| 2004/0035846 A1* | 2/2004 | Hiramatsu et al. | ....... 219/444.1 |
| 2006/0076108 A1 | 4/2006 | Holland et al. | |
| 2007/0138601 A1 | 6/2007 | Fan et al. | |

FOREIGN PATENT DOCUMENTS

| | | |
|---|---|---|
| EP | 1345472 A1 | 9/2003 |
| GB | 2363046 A | 12/2001 |
| JP | 04079182 A | 3/1992 |
| WO | WO2008027305 A2 | 3/2008 |

* cited by examiner

*Primary Examiner*—Sang Y Paik
(74) *Attorney, Agent, or Firm*—Joseph E. Waters (57) ABSTRACT

A layered heater structure including an electrode layer and a localized tuning method for tuning the electrode layer of a layered heater structure with high precision is provided. The localized tuning method tunes the electrode layer to its proper local resistance to minimize temperature offsets on the heater surface and thus provide a desired thermal profile that is in marked contrast to conventional, non-localized resistance tuning approaches based on thickness trimming practices, such as grinding or blasting, or resistivity adjustment, such as local heat treatment.

14 Claims, 10 Drawing Sheets

ELECTRODE TUNING METHOD AND APPARATUS FOR A LAYERED HEATER STRUCTURE

BACKGROUND OF THE INVENTION

1. Field of the Invention

The present invention generally relates to heaters on which heating-subject articles are loaded to undergo heat processes. More specifically, the present invention relates to heaters that can be advantageously used in semiconductor manufacturing equipment, where they are especially used for heat-treating semiconductor wafers.

2. Description of the Related Art

In the fabrication of electronic circuits and displays, semiconductor, dielectric, and electrically conducting materials are formed on a substrate, such as for example, a semiconductor wafer, ceramic or glass substrate. The materials are formed for example, by chemical vapor deposition (CVD), physical vapor deposition (PVD), ion implantation, oxidation, nitridation and other such processes. Thereafter, the deposited substrate materials can be etched to form features such as gates, vias, contact holes and interconnect lines. These processes are typically carried out in a process chamber, as for example described in U.S. Pat. No. 6,491,978, to Kalyanam et al. In such processes, the substrate is placed on a substrate support and exposed to a process zone in the chamber. The support often includes a heater to further regulate the temperatures of the substrate during processing.

The heat generation of the heater is directly related to the electrode properties and geometry. In a layered heater structure where a thin layer of electrode is placed on an insulating substrate, the electrode resistivity and thickness play critical roles in achieving a desired temperature profile at the heater surface. For most of the wafer processes, a uniform thermal profile with less than 1% variation is required. An even tighter temperature range for the repeatability of heater products is desirable. The applicants are not aware of any known film deposition technique demonstrating a synthesis of electrode layer meeting the uniformity requirements, both in electrical properties and thicknesses.

In general, a small variation of a few percent in the electrode resistivity or thickness will cause a noticeable temperature offset on the heater surface. A common electrode characterizing method uses a four-point probe measurement to map the sheet resistance profile across the electrode. The typical resolution of the four-point probe measurement gage is $10^{-3}$ Ohm/sq and less. Such a resolution makes the gage incapable of capturing the resistance variation when the electrode layer has a sheet resistance of $10^{-2}$ Ohm/sq and less. Other electrode characterization methods, such as the use of resistance meters, also have a resolution limitation. Another drawback of using resistance meters is the contact resistance between the electrical probes and the electrode surface, which contribute a large portion of the measurement variation. For an electrode layer with a total resistance of 10 Ohm, an acceptable electrode characterization gage needs to have a resolution of $10^{-3}$ Ohm or less in resistance and 25 um in space and to be independent of the contact resistance. The applicants are not aware of any existing gage system that meets these requirements.

In addition, there is no precise technique of tuning the electrode to the right resistivity or thickness even if the characterization method were not an issue. Since the heater local temperature is very sensitive to the local sheet resistance of the electrode layer, thickness trimming practices, such as grinding or blasting, and resistivity adjustment, such as local heat treat, are very aggressive and uncontrollable which does not make them suitable for precisely tuning the electrode resistance within a few percent. A drawback of these practices is that they are typically very labor intense and time consuming.

SUMMARY OF THE INVENTION

Therefore, the present invention has been made in view of the above problems and provides a localized tuning method for tuning the electrode layer of a layered heater structure with high precision. As discussed above, some form of tuning of these electrode layers to their proper sensitivity and thickness is critically important to minimize temperature offsets on the heater surface. The present invention provides a method for performing a precise localized resistance tuning of an electrode layer to minimize temperature offsets and thus provide a uniform heating profile that is in marked contrast to conventional, non-localized resistance tuning approaches based on thickness trimming practices, such as grinding or blasting, or resistivity adjustment, such as heat treat.

Among the many benefits provided by the invention is the realization of a uniform thermal profile at the heater surface or other desired thermal profiles that can be achieved only with uniform electrode layer both in thickness and resistivity. A uniform thermal profile of the heater surface is possible because tuning of the electrode layer resistance is accomplished in a localized manner. Precise localized tuning is a very important physical effect because it is the basis for achieving the necessary electrode layer resistance uniformity for optimal thermal performance. In a preferred embodiment, the localized resistance tuning method of the invention advantageously provides less than 1% variation across the heater surface, not attainable with prior art approaches.

BRIEF DESCRIPTION OF THE DRAWINGS

These and other objects, features and advantages of the invention will be apparent from a consideration of the following Detailed Description Of The Invention considered in conjunction with the drawing Figures, in which.

DETAILED DESCRIPTION OF THE PREFERRED EMBODIMENTS

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

The present invention is directed to techniques for performing resistance tuning on the electrode layer 106 with high precision.

1. Heater Structure

Figure 1:
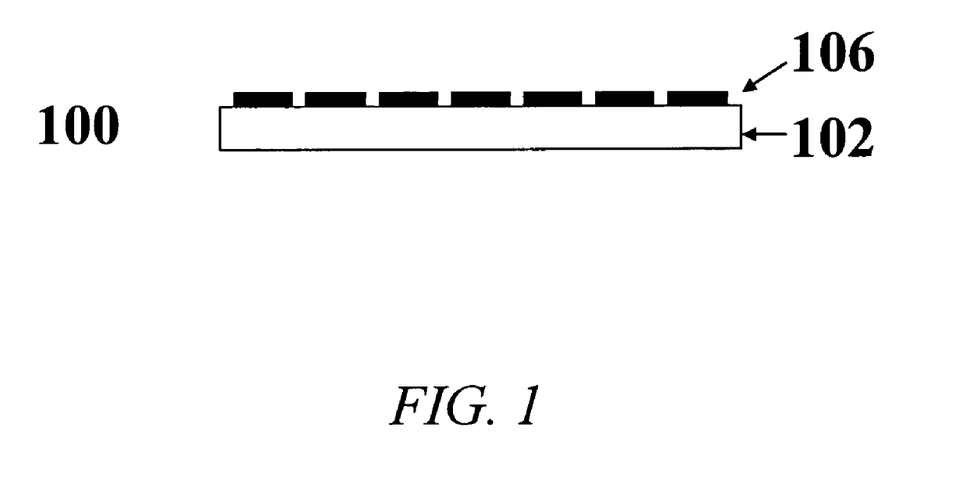
FIG. 1 illustrates a heater structure in a cut-away view, according to one embodiment.

Referring now to FIG. 1, which illustrates a conventional heater structure 100 in cut-away view. The heater structure 100 is shown to be a layered device comprised of two or more contiguous layers including, a base layer 102, sometimes referred to as the heater layer 102, forming the foundation of the heater structure 100, and an electrode layer 106, sometimes referred to as the heating layer, directly overlaying the base layer 102. Heater structures 100, such as the one shown in FIG. 1, are well-known in the art. A common variation from heater structure 100 is having additional insulating layers overcoat the electrode layer 106 for the purpose of sealing or protection.

Figure 2:
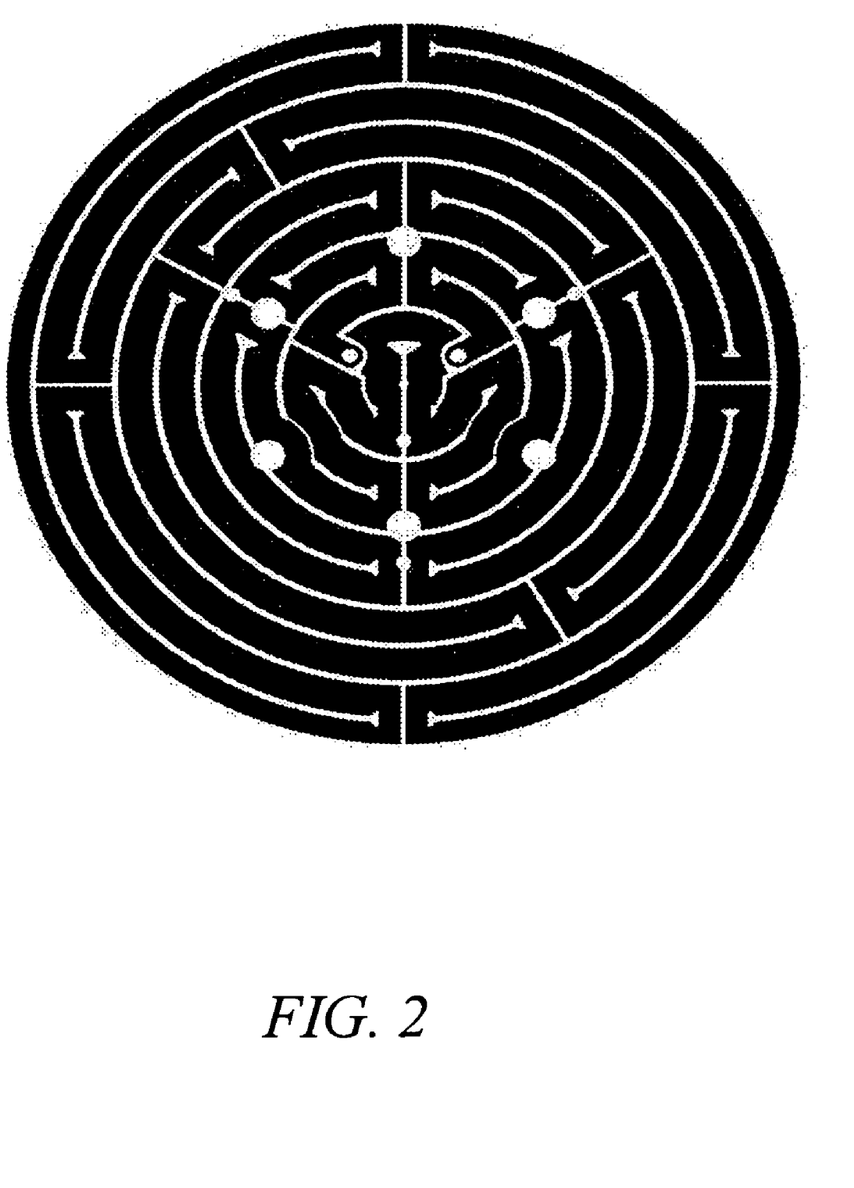
FIG. 2 is an illustration of an electrode layer of FIG. 1 prior to performing resistance tuning.

FIG. 2 illustrates a plane view of the electrode layer 106 of FIG. 1 prior to performing a resistance tuning in accordance with an embodiment of the invention. A key feature of the invention is that the resistance tuning is a localized high-precision resistance tuning which achieves a target resolution of $10^{-4}$ Ohm across the surface of the electrode layer, with less than 1% variation. The resistance tuning method, to be described below, identifies and corrects small variations in the electrode layer's resistivity or thickness, on the order of a few percent, which can cause a noticeable undesirable temperature offset on the surface of the heater structure 100.

2. Tuning Method

Figure 3:
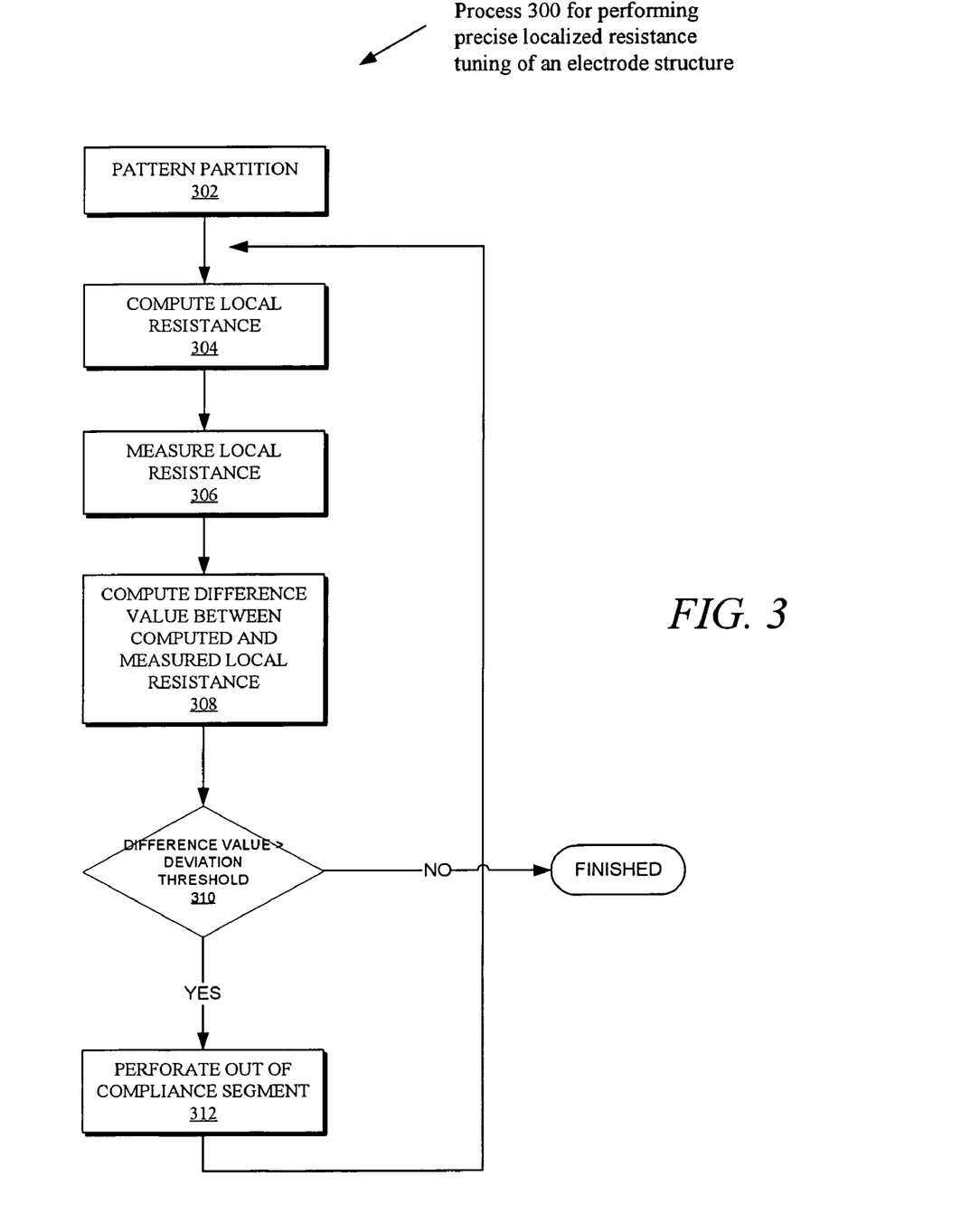
FIG. 3 illustrates a process for performing a precise localized resistance tuning of the electrode layer, according to one embodiment.

With reference now to FIG. 3, there is shown a process 300 for performing a precise localized resistance tuning of the electrode component 106, according to one embodiment.

It is understood that process 300 is performed on an electrode layer 106, such as the one shown in FIG. 2 with a particular electrode pattern, with the pattern having a particular construction according to a desired heating profile for fabrication onto a base layer 102 (see FIG. 1).

At step 302: an electrode layer 106, having a particular electrode pattern, is virtually partitioned into at least one segment. Each virtually partitioned segment may be as small as 1 mm in length and as large as 1000 mm. Ideally, smaller segments result in more accurate thermal profile control. In one embodiment, the length of a heater segment is on the order of 60 mm, which corresponds to a local segment resistance on the order of 10 to $50 \times 10^{-3}$ Ohm. The lower bound of the segment length (i.e., 1 mm) is determined by the size of the measurement probe and the resolution of the measurement gage. It should be understood that the total number of segments is a function of both the segment size and the electrode pattern design.

At step 304: the local resistance of each virtually partitioned segment is computed based on the geometry and material properties, to identify potential targets for the tuning step 308, to be described. In some embodiments, this step can be performed numerically or analytically. In one embodiment, the step may be performed numerically by utilizing finite element analysis based on an electrostatic model. In other embodiments, this step may be performed analytically by utilizing electrical and geometrical properties of the electrode and calculating the resistance based on $R=\rho.L/A$, where $\rho$ is the resistivity of the electrode material, L is the length of the segment and A is the cross section area of the electrode, respectively. It should be understood that an analytical approach is best suited to very simple electrode paths such as straight lines, circles, and arches etc. It is noted that this step provides a theoretical baseline comparison when taking actual resistance measurements of each local segment (i.e., step 306) which accounts for the electrode's dimension and property variations.

At step 306: the resistance of each actual segment of the electrode layer 106, virtually partitioned at step 302, is measured to identify those segments whose local resistance differs from the numerically or analytically computed local resistance, determined at step 304, by an amount which exceeds a pre-defined tolerance. In one embodiment, the pre-defined tolerance is less than 1%. In other words, the measured local resistance of a segment may not deviate from the computed local resistance of that segment by more than 1%. In one embodiment, the local resistance of each segment is measured using a 4-point probe technique, described further below with reference to FIG. 4.

At step 308: a difference value is computed between the computed and measured local resistances for each segment.

At step 310: a determination is made for each segment regarding whether the difference value computed for each segment at step 308 exceeds a pre-determined deviation threshold. Whenever the pre-determined deviation threshold is exceeded for a given segment, it is understood that the segment is out of compliance with a target segment resistance and the segment must be perforated to bring it within compliance, (see step 312). Otherwise, if all segments are determined to be within compliance, the process terminates.

Figure 6:
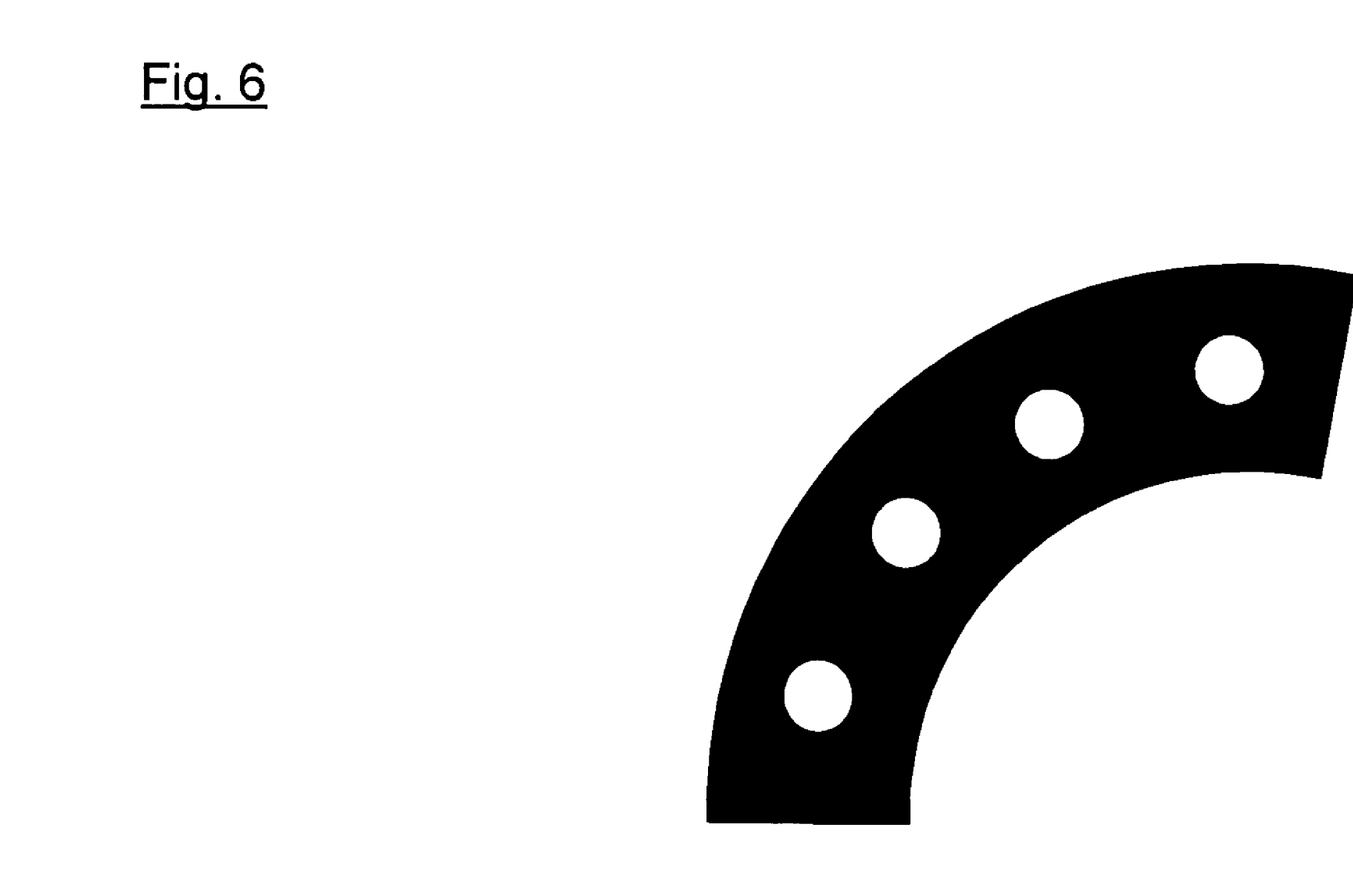
FIGS. 6-10 illustrate various physical features which may be introduced into a partitioned segment, according to embodiments of the invention.
Figure 7:
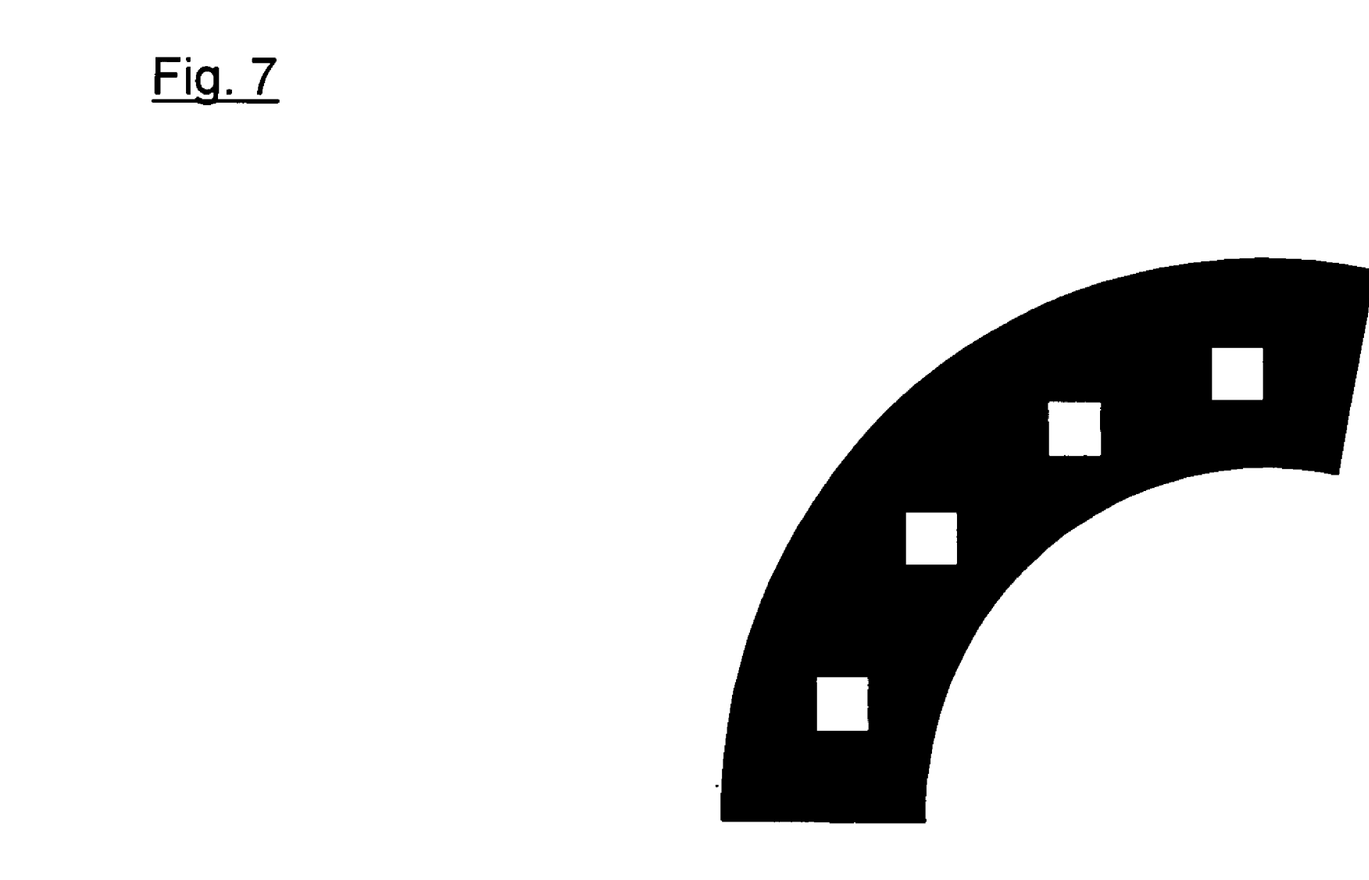
Figure 8:
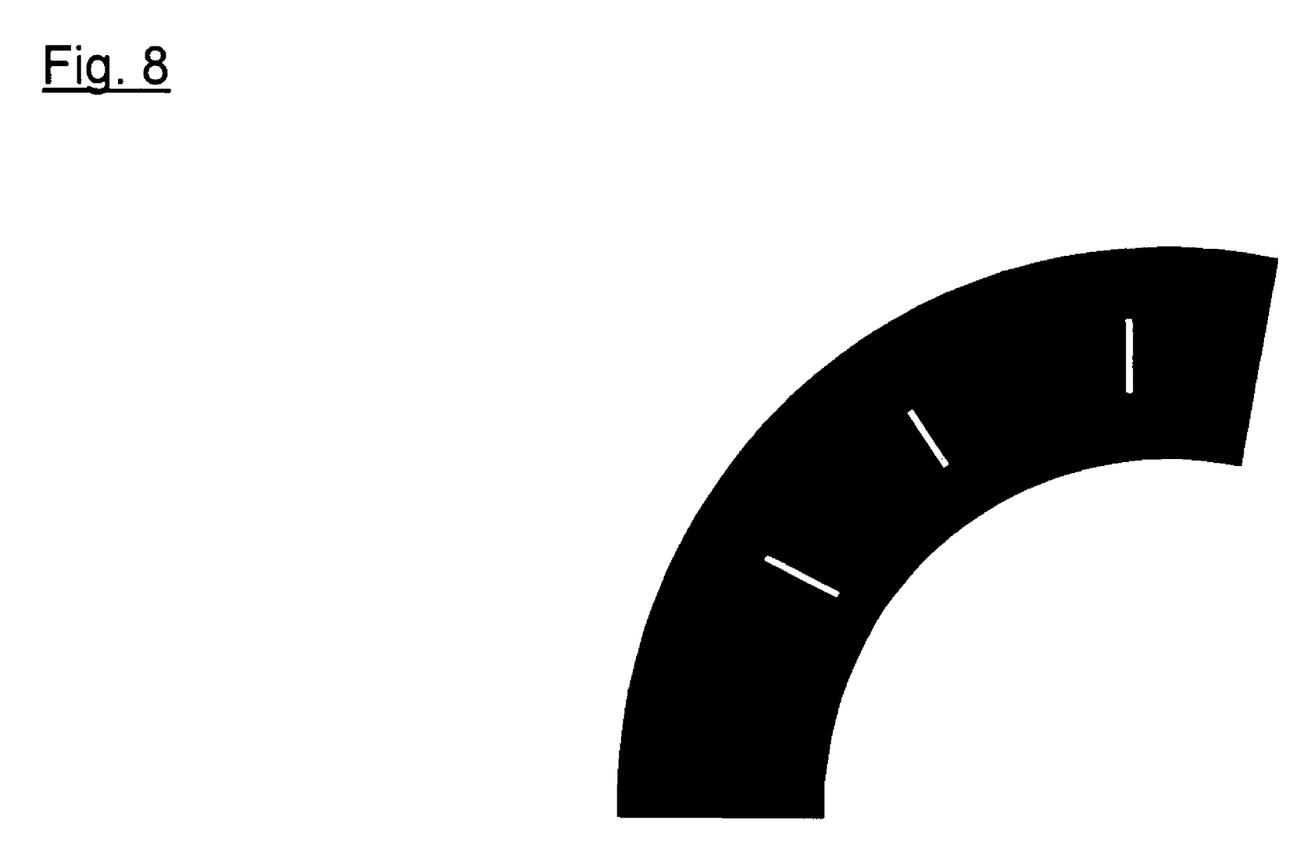
Figure 9:
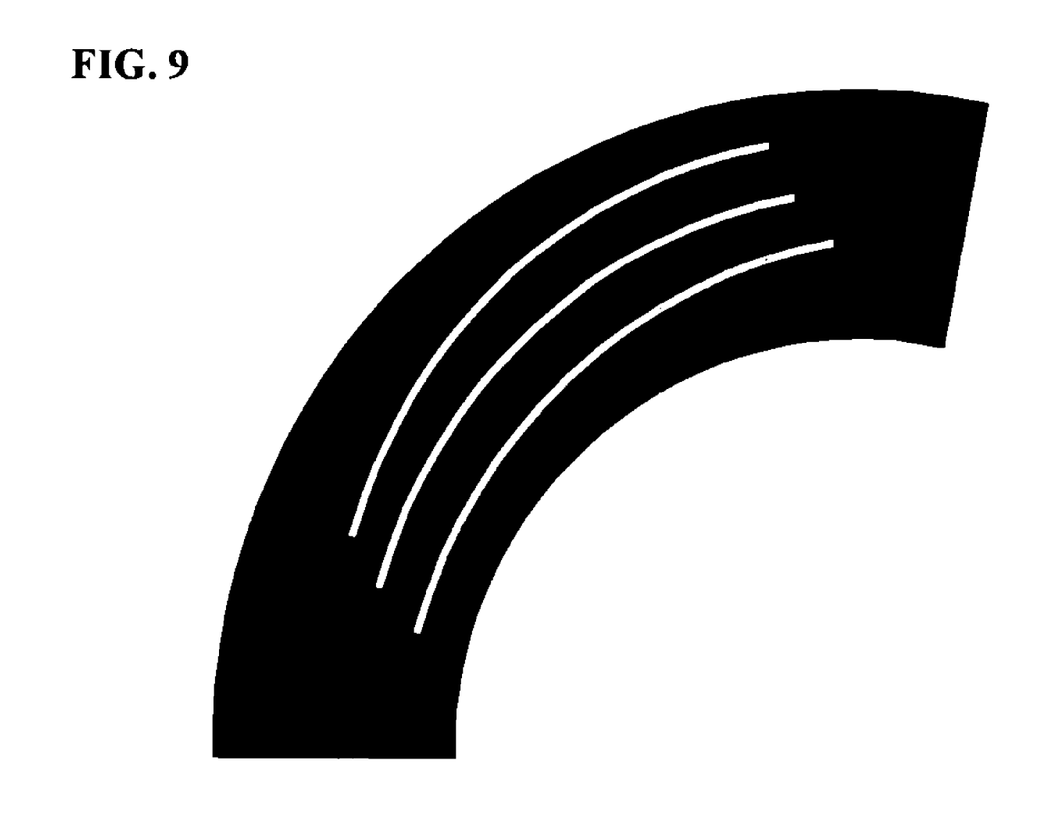
Figure 10:
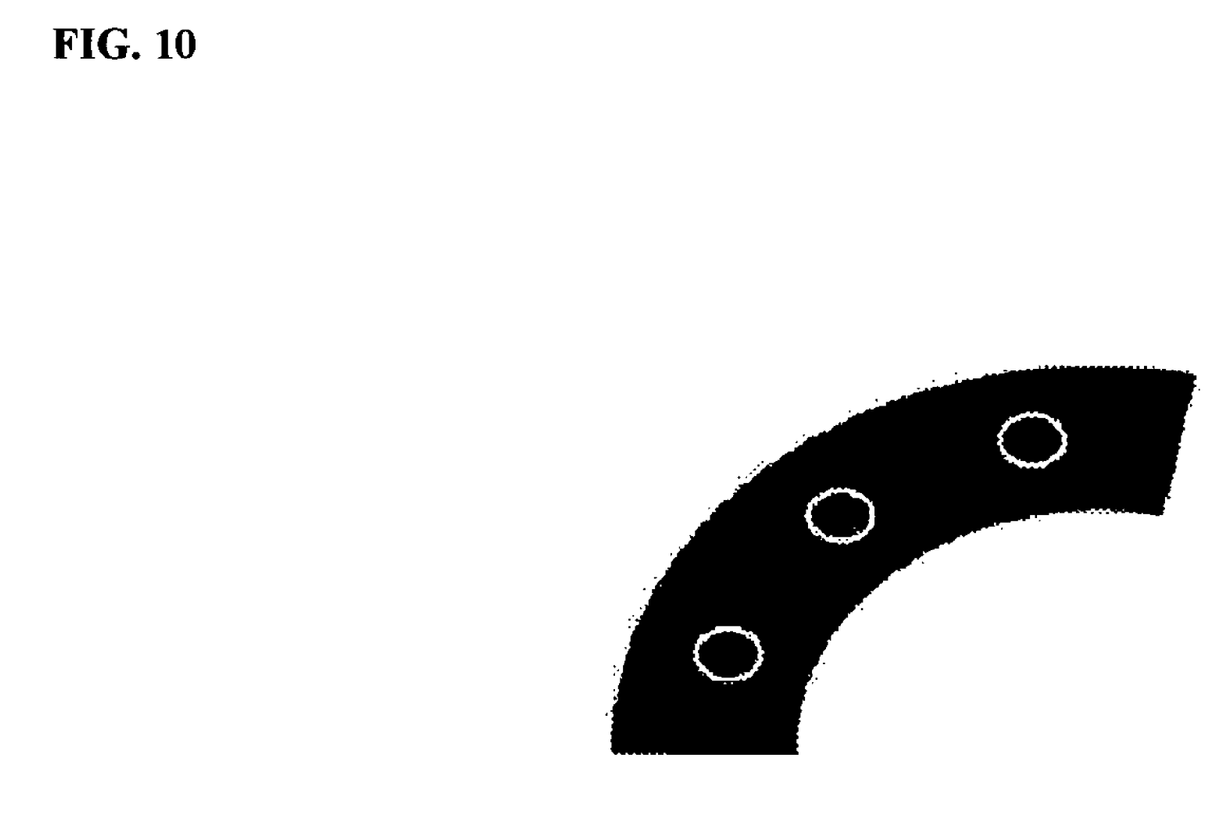

At step 312: the electrode layer 106 is perforated at those segments identified as being out of compliance with the target segment resistance to make those segments compliant. Perforation can be performed in a number of ways, including, for example, perforating the segment with voids or with other feature types that cause a reduction in the cross-section of the electrode segment. In one embodiment, a feature type may be an open area with no conductive electrode material inside, such as circular, oval, square or any shape of voids, such as illustrated in FIGS. 6-7, and curved or straight line cut, such as illustrated in FIGS. 8-9. In another embodiment, a feature may be formed by a loop cut that isolates part of the electrode layer from the rest, such as illustrated in FIG. 10, which effectively reduces the area of conductive electrode layer. In other embodiments, the perforation may be performed using any combination of the afore-mentioned features. Perforation can be done by machining, etching, or blasting to remove the electrode material throughout the electrode layer 106, as is well known in the art. It should be understood that the number, size and location of the holes (or add on features) are determined at step 308 based on the difference between the computed and measured local resistance.

The process returns to step 304 to re-compute the local resistance of each segment.

In the process described above, steps 304 through 312 may be repeated as many times as there are segments, until a last segment is reached. Alternatively, steps 304 through 312 are completed throughout the entire electrode before moving to the next step, as described above, and, therefore, no repeat loop is required in this regard.

Figure 4:
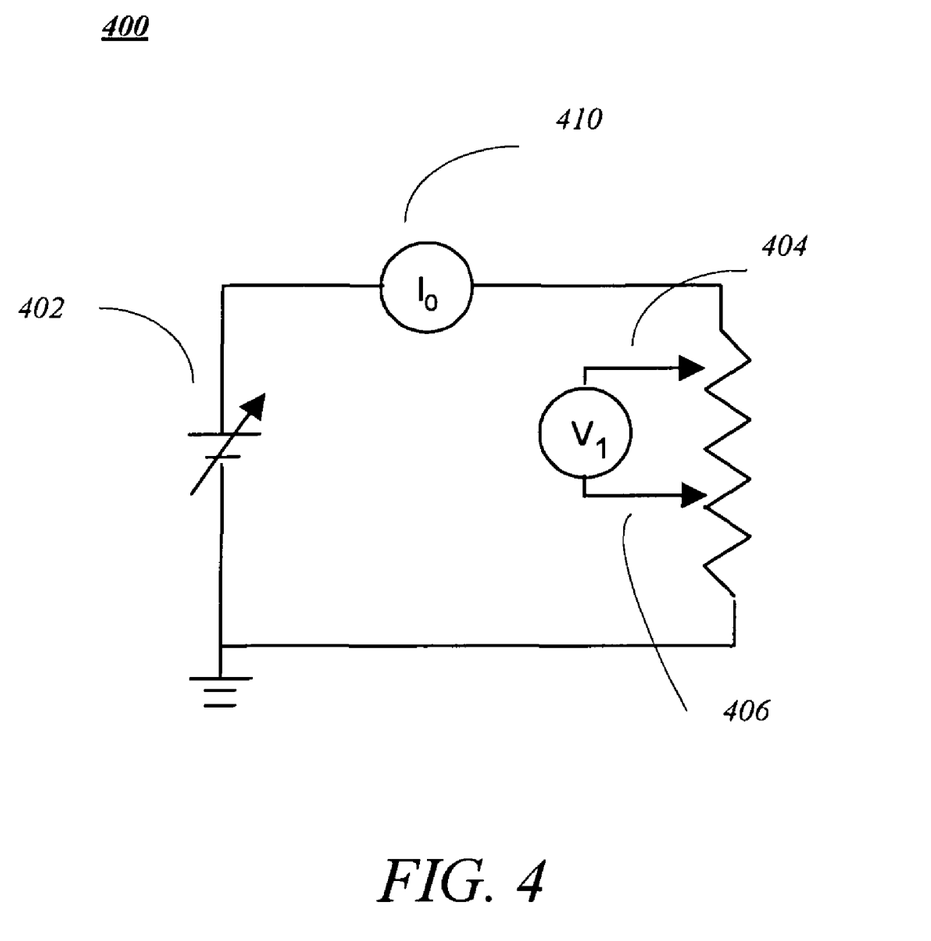
FIG. 4 illustrates an exemplary circuit diagram for measuring the resistance of each segment of the electrode layer of FIG. 2, according to one embodiment.

FIG. 4 illustrates an exemplary circuit diagram 400 for measuring the resistance of each segment of an electrode layer 106 (see FIGS. 1 & 2) in accordance with resistance measurement step 306 above. The circuit 400 includes a DC power supply 402 for providing a fixed current, as measured by current meter 410, through the electrode 106. In some embodiments, the power supply may be an AC power supply. The supplied current is constantly monitored by a precise current meter.

Figure 5:
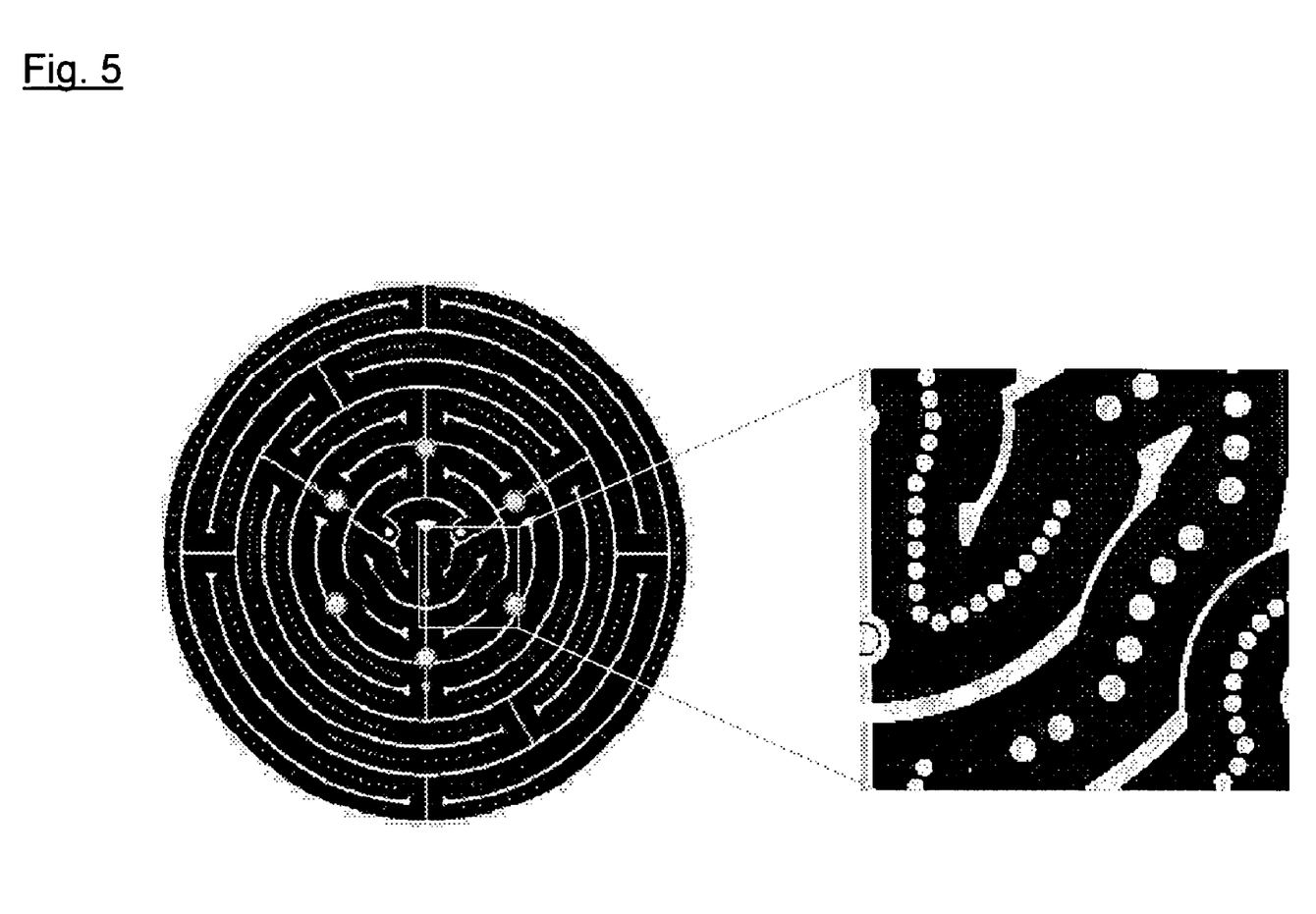
FIG. 5 illustrates an example of the electrode layer shown in FIG. 2 after resistance tuning.

FIG. 5 illustrates, by way of example, the electrode layer 106 of FIG. 2 after resistance tuning. The size and density of the plurality of perforations applied along the electrode in FIG. 5 is determined by the difference between the computed and measured local resistance for each virtual segment. The variation in the computed and measured local resistance indicates the non-uniformity of the local resistance of the electrode layer, which is corrected by applying one or more perforations. The result of this resistance tuning, shown by way of example in FIG. 5, will precisely adjust the local resistance of the electrode layer to approximate its theoretic value, which only can be obtained with ideal uniform resistivity and thickness of the electrode layer.

In the presently described embodiment, a first electrical probe 404 (reference probe) is mounted onto the electrode 106 at a fixed location. A second probe 406 measures the potential at various interesting points along the electrode surface with respect to the first probe 404. In another embodiment, both electrode probes 404 and 406 are movable along the electrode and the voltage potential between the two probes is captured. The measurement point locates at the end of each electrode segment which has been predefined in the step 302, namely pattern partition (consistent with FIG. 3).

It should be understood that the present invention is not limited to the four point probe technique. Other resistance measurement techniques which may be utilized by the invention, include, for example, thermal mapping, thickness measurement, and Ohm meter techniques.

FIGS. 6-10 illustrate various physical features, by way of example and not limitation, which may be introduced into partitioned segments, according to embodiments of the invention. For example, FIG. 6 illustrates a heating electrode perforated with a plurality of round voids to locally adjust the electrical resistance, FIG. 7 illustrates a heating electrode perforated with a plurality of square voids to locally adjust the electrical resistance, FIG. 8 illustrates a heating electrode perforated with a plurality of straight line cuts to locally adjust the electrical resistance, FIG. 9 illustrates a heating electrode perforated with a plurality of curved line cuts to locally adjust the electrical resistance, and FIG. 10 illustrates a heating electrode perforated with a plurality of loop cuts to locally adjust the electrode resistance.

Of course, in some embodiments, a partitioned segment may include one or more physical features of any geometric shape or combination.

There have been provided new and improved methods and apparatus for performing a local resistance tuning for use with a layered heater structure. In the described embodiment, the method operates by inserting certain physical features into the electrode layer of the heater structure at certain identified locations with precision to increase the local resistance to meet a desired thermal profile. The invention advantageously provides a desired thermal profile of the heater surface of a layered heater structure due to tuning of the electrode layer in a localized manner.

It should be appreciated that the present invention can be implemented in numerous ways, including as a process, an apparatus, a system, a device, a method, or a computer readable medium such as a computer readable storage medium or a computer network where program instructions are sent over optical or electronic communication links.

As used herein, the terms "first", "second," and the like do not denote any order or importance, but rather are used to distinguish one element from another, and the terms "the", "a", and "an" do not denote a limitation of quantity, but rather denote the presence of at least one of the referenced item. All ranges disclosed herein are inclusive of the endpoints and are independently combinable. Also, as used in the specification and in the claims, the term "comprising", may include the embodiments "consisting of" and "consisting essentially of."

While the invention has been described with reference to an example embodiment, it will be understood by those skilled in the art that a variety of modifications, additions and deletions are within the scope of the invention, as defined by the following claims.

What is claimed is:

1. A method for performing a precise localized resistance tuning of an electrode layer of a layered heater structure, the method comprising:
   virtually partitioning a pre-determined pattern of the electrode layer into at least one segment;
   (ii) computing, for each virtually partitioned segment, a local target segment resistance based on segment geometry;
   (iii) measuring, for each virtually partitioned segment, a local segment resistance;
   (iv) computing, for each virtually partitioned segment a difference value between said local target segment resistance and said local measured segment resistance;
   (v) computing, for each virtually partitioned segment, the number of through-thickness perforations with selected size and shape needed to increase the local segment resistance to meet the target segment resistance; and
   (vi) introducing at least one through-thickness perforation, based on the above calculation, into each of the identified partitioned segments to sufficiently modify the electrical resistance of the identified partitioned segments such that the modified electrical local segment resistance does not deviate from said target segment resistance by an amount exceeding a absolute value of an pre-determined threshold.

2. A method according to claim 1, wherein said introduced perforation alters an electrical current flow of the identified partitioned segments.

3. A method according to claim 1, wherein said introduced perforation reduces an effective cross-section of the identified partitioned segments.

4. A method according to claim 1, wherein said at least one perforation is selected from the group comprising: a circular void, an oval void, a square void, a curved line cut, a straight line cut, and an isolation loop.

5. A method according to claim 1, further comprising: repeating steps (ii) through (vi) for all partitioned segments identified at said step (ii) until no further identified virtually partitioned segments remain having a local segment resistance that deviates from said target segment resistance by an amount exceeding said absolute value of said pre-determined deviation threshold.

6. A method according to claim 1, wherein said step of computing a local target segment resistance for each virtually partitioned segment is a numerical computation.

7. A method according to claim 6, wherein said numerical computation comprises: utilizing finite element analysis based on an electrostatic model of the electrode.

8. A method according to claim 1, wherein said step of computing a local target segment resistance for each virtually partitioned segment is an analytical computation.

9. A method according to claim 8, wherein said analytical computation further comprises: utilizing electrical and geometrical properties of the electrode to calculate a segment resistance based on the relation, $R = \rho \cdot L/A$, where $\rho$ is the resistivity of the electrode material, L is the length of the electrode segment and A is the cross section area of the electrode.

10. A method according to claim 1, wherein said measuring step further comprises measuring the local segment resistance using a measurement technique selected from the group comprising: a 4-point probe measurement, thermal mapping, thickness measurement, and Ohm meter measurement.

11. A method according to claim 1, wherein said predetermined threshold is substantially +/−1% of said target segment resistance.

12. A method according to claim 1, wherein the number of virtually partitioned segments is a function of segment size and an electrode pattern design.

13. A method according to claim 12, wherein a segment size of each of said segment is substantially in the range of 1 mm to 1000 mm per segment.

14. A method according to claim 1, wherein a total number of virtually partitioned segments is arbitrarily selected.

* * * * *